(12) United States Patent
Takahashi

(10) Patent No.: US 10,859,403 B2
(45) Date of Patent: Dec. 8, 2020

(54) POSITION DETECTING APPARATUS AND ACTUATOR

(71) Applicant: Koganei Corporation, Tokyo (JP)

(72) Inventor: Yoshihiro Takahashi, Koganei (JP)

(73) Assignee: Koganei Corporation, Tokyo (JP)

( * ) Notice: Subject to any disclaimer, the term of this patent is extended or adjusted under 35 U.S.C. 154(b) by 92 days.

(21) Appl. No.: 16/305,471

(22) PCT Filed: Apr. 21, 2017

(86) PCT No.: PCT/JP2017/016081
§ 371 (c)(1),
(2) Date: Nov. 29, 2018

(87) PCT Pub. No.: WO2017/208674
PCT Pub. Date: Dec. 7, 2017

(65) Prior Publication Data
US 2020/0056905 A1    Feb. 20, 2020

(30) Foreign Application Priority Data

Jun. 2, 2016  (JP) .................................. 2016-111310
Jun. 2, 2016  (JP) .................................. 2016-111311

(51) Int. Cl.
*G01D 5/14*   (2006.01)
*F15B 15/28*  (2006.01)
(Continued)

(52) U.S. Cl.
CPC .......... *G01D 5/145* (2013.01); *F15B 15/2861* (2013.01); *G01R 33/072* (2013.01); *G01R 33/091* (2013.01)

(58) Field of Classification Search
CPC . F15B 15/2861; G01R 33/072; G01R 33/091; G01D 5/145
See application file for complete search history.

(56) References Cited

U.S. PATENT DOCUMENTS 5,231,352 A    7/1993  Huber
5,233,293 A *  8/1993  Huang ..................... G01P 3/52
                                                    324/207.15
(Continued)

FOREIGN PATENT DOCUMENTS

JP    H11303818 A    11/1999
JP    2008185406 A    8/2008
(Continued)

OTHER PUBLICATIONS

European Search Report for Serial No. 17806234.5 dated Dec. 9, 2019.
(Continued)

*Primary Examiner* — Patrick Assouad
*Assistant Examiner* — Demetrius R Pretlow
(74) *Attorney, Agent, or Firm* — McCormick, Paulding & Huber PLLC

(57) ABSTRACT

A position detecting apparatus has: a first bridge circuit configured to output a SIN signal depending on a movement of a magnet that is movable in a magnetization direction, a second bridge circuit configured to output a COS signal. An area-identifying element having a magnetic-field direction-detecting sensor is configured to determine whether the magnet is in an area defined on one side from a center of a bridge circuit in a moving direction of the magnet, or in an area defined on the other side from the center of the bridge circuit in the moving direction of the magnet. An ATAN2 signal having a main area signal and a shift area signal is computed on the basis of the sin signal and the cos signal, and a position of the magnet is computed on the basis of a signal of the magnetic direction-detecting sensor and the ATAN2 signal.

14 Claims, 12 Drawing Sheets

(51) Int. Cl.
*G01R 33/07* (2006.01)
*G01R 33/09* (2006.01)

(56) References Cited

U.S. PATENT DOCUMENTS

| | | | | |
|---|---|---|---|---|
| 6,011,390 | A * | 1/2000 | Loreit | G01D 5/145 324/207.21 |
| 8,525,513 | B2 * | 9/2013 | Servel | G01D 5/145 324/207.21 |
| 2004/0017187 | A1 * | 1/2004 | Van Ostrand | G01D 5/145 324/207.21 |
| 2006/0006861 | A1 * | 1/2006 | Heinze | G01D 5/145 324/207.21 |
| 2006/0006864 | A1 * | 1/2006 | Johnson | G01P 13/04 324/252 |
| 2008/0272771 | A1 * | 11/2008 | Guo | G01R 33/098 324/260 |
| 2009/0115405 | A1 * | 5/2009 | Guo | G01D 5/145 324/207.14 |
| 2009/0206827 | A1 * | 8/2009 | Aimuta | G01D 5/145 324/207.25 |
| 2009/0295375 | A1 | 12/2009 | Oohira | |
| 2009/0309580 | A1 * | 12/2009 | Dmytriw | G01R 33/09 324/207.21 |
| 2009/0315547 | A1 * | 12/2009 | Abwa | G01R 33/02 324/244 |
| 2010/0060263 | A1 * | 3/2010 | Granig | G01D 5/145 324/202 |
| 2011/0025322 | A1 * | 2/2011 | Yamazaki | G01R 33/091 324/252 |
| 2011/0234215 | A1 | 9/2011 | Ausserlechner | |
| 2011/0246133 | A1 | 10/2011 | Harada et al. | |
| 2013/0063132 | A1 * | 3/2013 | Youngner | G01D 5/145 324/202 |
| 2013/0168125 | A1 * | 7/2013 | Hama | G01L 3/104 174/73.1 |
| 2013/0199286 | A1 * | 8/2013 | Gao | G01N 9/04 73/152.27 |
| 2016/0015885 | A1 * | 1/2016 | Pananen | A61J 1/1481 604/111 |
| 2016/0320459 | A1 * | 11/2016 | Mather | G01R 33/096 |
| 2018/0052208 | A1 * | 2/2018 | Onaka | G01R 33/07 |
| 2018/0238711 | A1 * | 8/2018 | Zimmer | G01D 5/145 |
| 2019/0049230 | A1 * | 2/2019 | Kurosawa | H02K 41/03 |
| 2019/0077256 | A1 * | 3/2019 | Onaka | B60K 20/02 |
| 2019/0120659 | A1 * | 4/2019 | Bussan | G01D 5/145 |
| 2019/0257671 | A1 * | 8/2019 | Osabe | G01R 33/06 |

FOREIGN PATENT DOCUMENTS

| | | |
|---|---|---|
| JP | 2009128301 A | 6/2009 |
| JP | 2010048698 A | 3/2010 |
| JP | 2011180001 A | 9/2011 |
| JP | 2014006053 A | 1/2014 |
| WO | 2005078395 A1 | 8/2005 |

OTHER PUBLICATIONS

International Search Report for PCT Serial No. PCT/JP2017/016081 dated Jun. 6, 2017.

* cited by examiner (A)

(B)

POSITION DETECTING APPARATUS AND ACTUATOR

CROSS-REFERENCE TO RELATED APPLICATIONS

This application is a National Stage application of International Patent Application No. PCT/JP2017/016081, filed on Apr. 21, 2017, which claims priority to Japanese Patent Application Numbers 2016-111310, filed on Jun. 2, 2016; and 2016-111311, filed on Jun. 2, 2016, each of which is hereby incorporated by reference in its entirety.

TECHNICAL FIELD

The present invention relates to a position detecting apparatus configured to detect the position of a reciprocating member, and to an actuator provided with the position detecting apparatus.

BACKGROUND

An actuator is used to drive a member to be driven, such as workpiece and jig, and also to drive hands for gripping and holding a workpiece, etc., as members to be driven, to open and close the hands. The actuator has a reciprocating member to be driven by air pressure or hydraulic pressure, and the reciprocating member is electrically connected to a member to be driven. In this actuator, a magnet is attached to the reciprocating member, and a sensor head having a magnetoresistive element configured to detect a magnetic field generated by the magnet is fitted to an actuator body. In this actuator, the position of the reciprocating member can be detected on the basis of an output signal of the magnetoresistive element.

For example, Japanese Patent Laid-open Publication No. 2009-128301 discloses a magnetic liner measuring apparatus having two magnetoresistive elements provided to respective spots in a sensor head. The magnetoresistive elements are respective placed at positions shifted to each other in a moving direction of a piston. In this magnetic liner measuring apparatus, when the magnet is located between two magnetoresistive elements by movement of the piston that is a reciprocating member, the position of the piston is detected by this element. Japanese Patent Laid-open Publication No. H11-303818 discloses a position detecting apparatus having two magnetoresistive elements arranged perpendicular to each other and configured to detect the position of a piston in a hydraulic pressure cylinder. In this position detecting apparatus, since fluctuations in output voltages of the magnetoresistive elements are caused in response to temperature changes, a temperature compensating circuit is configured to compensate for a temperature change. Furthermore, Japanese Patent Laid-open Publication No. 2010-48698 discloses a position detecting apparatus in which an LED is provided to a sensor head attached to an actuator body, and configured to turn on depending on the position of a moving member. This position detecting apparatus has two magnetoresistive bridge circuits each composed of four magnetoresistive elements. Each magnetoresistive bridge circuit is configured to output an outputs signal having a phase difference in the moving direction of a magnet.

SUMMARY

In Japanese Patent Laid-open Publication No. 2009-128301, when two magnetoresistive elements are placed at two positions different from each other in the moving direction of the reciprocating member, it is possible to detect the position of the reciprocating member only when the reciprocating member is within an area between the magnetoresistive elements. When, on the other hand, the reciprocating member is out of this area, it is not possible to identify the position of the reciprocating member. In addition, in Japanese Patent Laid-open Publication No. H11-303818, when a midpoint voltage of the two magnetoresistive elements is within a range defined by low and high reference voltages, i.e., two reference voltages, the position detecting apparatus outputs an on-signal to indicate whether the reciprocating member is within this range. Therefore, the position of the reciprocating member cannot be linearly identified in this apparatus. Furthermore, in Japanese Patent Laid-open Publication No. 2010-48698, the position of the reciprocating member is computed on the basis of output voltages of two magnetoresistive bridge circuits. Therefore, although the position of the reciprocating member can be detected with high accuracy, a position detectable range is limited.

An object of the present invention is to provide a position detecting apparatus which can detect the position of a magnet attached to a reciprocating member in the range of a long distance.

According to one aspect of the present invention, there is provided a position detecting apparatus configured to detect a position of a magnet that moves in a direction of magnetization, the position detecting apparatus comprising: a first bridge circuit including: a magnetoresistive element having a maximum sensitivity to a magnetic field in a first direction the same as the direction of magnetization; and a magnetoresistive element having a maximum sensitivity to a magnetic field in a second direction perpendicular to the first direction, the first bridge circuit outputting a SIN signal; a second bridge circuit including: a magnetoresistive element having a maximum sensitivity to a third direction tilted against the first direction by 45 degrees; and a magnetoresistive element having a maximum sensitivity to a fourth direction perpendicular to the third direction, the second bridge circuit outputting a COS signal; and area-identifying means having a magnetic-field direction-detecting sensor, and configured to output an area-identifying signal for identifying whether the magnet is in an area defined on one side from a center of the first bridge circuit and the second bridge circuit in a moving direction of the magnet, or in an area defined on the other side from the center of the first bridge circuit and the second bridge circuit in the moving direction of the magnet.

The first bridge circuit having magnetoresistive elements and the second bridge circuit having magnetoresistive elements have respective maximum sensitivity directions different from each other by 45 degrees, and respectively output the SIN signal and the COS signal. On the basis of an output voltage of the magnetic-field direction-detecting sensor, the position detecting apparatus determines whether the magnet is in an area on one side or an area on the other side in an axial direction with respect to the center of the first bridge circuit and second bridge circuit.

A signal corresponding to the position of the magnet is output on the basis of the SIN signal, the COS signal, and the area-identifying signal. In this manner, this allows the position of the magnet attached to a reciprocating member to be detected in the range of a long distance.

DESCRIPTION OF PREFERRED EMBODIMENTS

Figure 1:
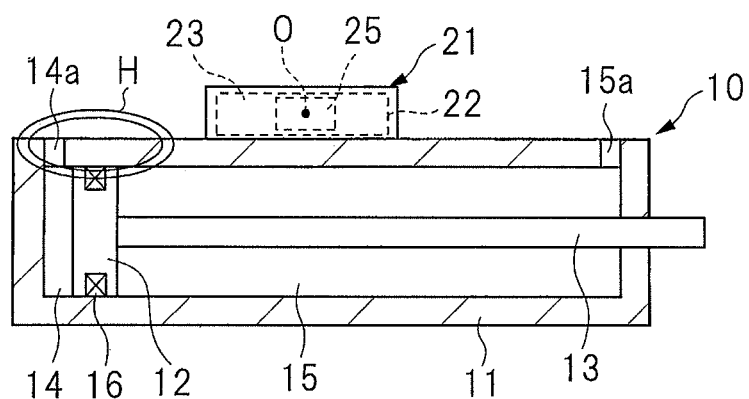
FIG. 1 is a vertical sectional view of an actuator having a position detecting apparatus.

Embodiments of the present invention will hereinafter be described in detail with reference to drawings. An actuator 10 shown in FIGS. 1 and 2 includes a cylinder 11 that is an actuator body. A piston 12 is provided as a reciprocating member, and fitted to the cylinder 11 so that the piston 12 can reciprocate in an axis direction thereof. The cylinder 11 and the piston 12 are made of non-magnetic material, such as aluminum alloy, and a piston rod 13 is attached to the piston 12. When compressed air is supplied via a port 14a into a pressure chamber 14 of the cylinder 11, the piston rod 13 is driven in a direction causing the piston rod 13 to protrude from the cylinder 11. When compressed air is supplied via a port 15a into a pressure chamber 15 of the cylinder 11, in contrast, the piston rod 13 is driven in a direction causing the piston rod 13 to move back into the cylinder 11. The piston rod 13 protrudes from one end of the piston 12 defined as a "rod end", and the other end of the piston 12 is defined as a "head end".

An annular magnet 16 is attached to the piston 12. The magnet 16 is fitted to an annular groove formed on the outer peripheral surface of the piston 12. The magnet 16 is magnetized in the moving direction of the piston 12, and is moved by the piston 12 in the magnetized direction. For example, one end of the magnet 16 is defined as "S-pole", the other end of the magnet 16 is defined as "N-pole", and the magnet 16 generates a magnetic field denoted by reference character "H" in FIG. 1.

In order to detect the axial position of the magnet 16 relative to the cylinder 11, a sensor head 21 is fitted to the cylinder 11. Therefore, by detecting the axial position of the magnet 16 through the sensor head 21, it is possible to detect the axial position of the piston 12. A printed circuit board 22 is placed in the sensor head 21. The printed circuit board 22 has a front surface and a back surface that respectively serve as a component mounting surface 23 and a component mounting surface 24. A magnetoresistive bridge circuit 25 is mounted on the component mounting surface 23, and a Hall element 26 functioning as a magnetic-field direction-detecting sensor is mounted on the component mounting surface 24.

Figure 3:
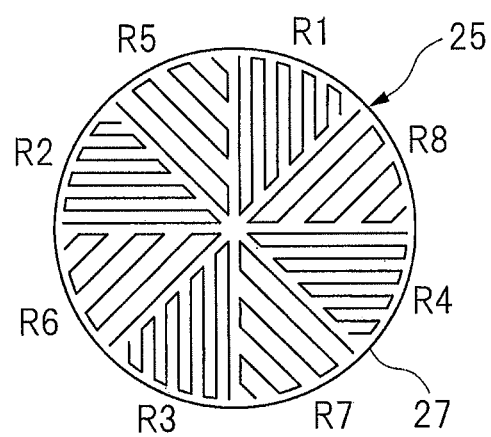
FIG. 3 is a plan view of wiring patterns of magnetoresistive elements.

The component mounting surfaces 23 and 24 extend outward in the radial direction of the piston 12 and extend along the moving direction of the piston 12. In other words, the component mounting surfaces 23 and 24 are set perpendicular to the cylinder 11. FIG. 3 is a plan view of wiring patterns of the magnetoresistive bride circuit 25. FIG. 4(A) shows a first bridge circuit 31 that is a bridge circuit formed by interconnecting magnetoresistive elements R1, R2, R3, and R4 selected from among those of magnetoresistive elements shown in FIG. 3. FIG. 4(B) shows a second bridge circuit 32 that is a bridge circuit formed by interconnecting magnetoresistive elements R5, R6, R7, and R8 selected from among those of the magnetoresistive elements shown in FIG. 3.

Wiring patterns of magnetoresistive elements are created by forming a film of magnetoresistive material on a substrate layer 27, and the film is formed into given shapes, using a microprocessing technique. Each pattern of the magnetoresistive element is made into a meandering shape by alternately connecting long strip-shaped patterns and short strip-shaped patterns perpendicular to each other. Each magnetoresistive element pattern shows a maximum change in resistance value in response to a change in a magnetic field applied in a direction perpendicular to long strip-shaped patterns, thus having a maximum sensitivity to a change in such a magnetic field. In contrast, the magnetoresistive element pattern shows a minimum change in resistance value in response to a change in a magnetic field applied in a direction along the long strip-shaped patterns.

At the first bridge circuit 31, as shown in FIG. 4(A), when the moving direction of the magnet 16 is denoted as a first direction M1, a first magnetoresistive element R1 has a maximum sensitivity to a magnetic field applied in the first direction M1. Meanwhile, a second magnetoresistive element R2 has a maximum sensitivity to a magnetic field applied in a second direction M2 perpendicular to the first direction M1. Likewise, a third magnetoresistive element R3 has a maximum sensitivity to a magnetic field applied in the first direction M1 and a fourth magnetoresistive element R4 has a maximum sensitivity to a magnetic field applied in the second direction M2.

The first magnetoresistive element R1 and the fourth magnetoresistive element R4 are electrically connected in series through a wiring pattern 35b to make up a first half-bridge 31a that is a first circuit pattern. The second magnetoresistive element R2 and the third magnetoresistive element R3 are electrically connected in series through a wiring pattern 35a to make up a second half-bridge 31b that is a second circuit pattern. Output voltages "A" and "B" are respectively extracted from connection terminals 36a and 36b of the wiring patterns 35a and 35b.

A source voltage "Vcc" is applied to a connection terminal 34a of a wiring pattern 33a. The wiring pattern 33a electrically connects a source voltage node "Vcc" to the first magnetoresistive element R1 and the second magnetoresistive element R2. A connection terminal 34b of a wiring pattern 33b is electrically connected to a ground node "Gnd". The wiring pattern 33b electrically connects the ground node Gnd to the third magnetoresistive element R3 and the fourth magnetoresistive element R4. In this manner, the first bridge circuit 31 is provided as a full-bridge circuit having four magnetoresistive elements.

At the second bridge circuit 32, as shown in FIG. 4(B), a fifth magnetoresistive element R5 has a maximum sensitivity to a magnetic field applied in a third direction M3 tilted against the first direction M1 by 45 degrees. Meanwhile, a sixth magnetoresistive element R6 has a maximum sensitivity to a magnetic field applied in a fourth direction M4 perpendicular to the third direction M3. Likewise, a seventh magnetoresistive element R7 has a maximum sensitivity to a magnetic field applied in the third direction M3 and an eighth magnetoresistive element R8 has a maximum sensitivity to a magnetic field applied in the fourth direction M4.

The fifth magnetoresistive element R5 and the eighth magnetoresistive element R8 are electrically connected in series through a wiring pattern 39b to make up a third half-bridge 32a that is a third circuit pattern. The sixth magnetoresistive element R6 and the seventh magnetoresistive element R7 are electrically connected in series through a wiring pattern 39a to make up a fourth half-bridge 32b that is a fourth circuit pattern. Output voltages "C" and "D" are respectively extracted from connection terminals 40a and 40b of the wiring patterns 39a and 39b.

The source voltage Vcc is applied to a connection terminal 38a of a wiring pattern 37a. The wiring pattern 37a electrically connects the source voltage node Vcc to the fifth magnetoresistive element R5 and the sixth magnetoresistive element R6. A connection terminal 38b of a wiring pattern 37b is electrically connected to the ground node Gnd. The wiring pattern 37b electrically connects the ground node Gnd to the seventh magnetoresistive element R7 and the eighth magnetoresistive element R8. In this manner, the second bridge circuit 32 is provided as a full-bridge circuit having four magnetoresistive elements.

As shown in FIG. 3, the wiring patterns making up eight magnetoresistive elements R1 to R8 are formed on one substrate layer 27. When the center of the first bridge circuit 31 formed of the magnetoresistive elements R1 to R4 is denoted as "O", the second bridge circuit 32 formed of the magnetoresistive elements R5 to R8 is tilted around the center "O" against the first bridge circuit 31 by 45 degrees. In this manner, in the magnetoresistive bridge circuit 25, eight magnetoresistive elements R1 to R8 making up the first and second bridge circuits 31 and 32 are formed on the substrate layer 27 such that the magnetoresistive elements R1 to R8 are arranged at 45 degree intervals around the center "O".

Figure 2:
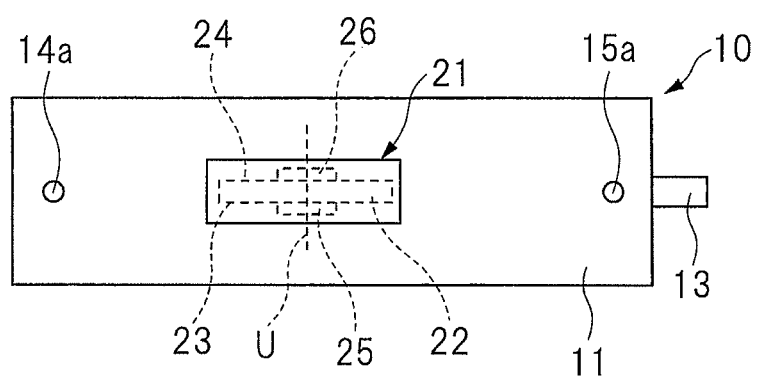
FIG. 2 is a plan view of the actuator of FIG. 1.

As shown in FIG. 2, the magnetoresistive bridge circuit 25 is mounted on the component mounting surface 23 of the printed circuit board 22. A magnetic field applied to the magnetoresistive bridge circuit 25 varies depending on the position of the piston 12. When the piston 12 moves, the first bridge circuit 31 outputs a first output signal, i.e., SIN signal (sine signal) according to the change in direction and strength of the magnetic field applied to the magnetoresistive elements R1 to R4. Meanwhile, the second bridge circuit 32 outputs a second output signal, i.e., COS signal (cosine signal), which is different in phase in the moving direction of the piston from the SIN signal, according to a change in the direction and strength of a magnetic field applied to the magnetoresistive elements R5 to R8. In this specification, for convenience, the first output signal output from the first bridge circuit 31 is referred to as "SIN signal", and the second output signal output from the second bridge circuit 32 is referred to as "COS signal". Neither the first output signal nor the second output signal is a repetitive signal, and therefore they are not defined exactly as a sine (SIN) signal and a cosine (COS) signal. Nevertheless, both signals are referred to as "sine signal" and "cosine signal", respectively, for convenience sake.

Based on the SIN signal and the COS signal, an ATAN2 value is computed. The ATAN2 value is given as an arctangent in X-Y coordinate, indicating an angle made between a segment connecting a coordinate point defined based on the SIN signal and the COS signal to the origin and the X-axis. In this specification, the arctangent is expressed as ATAN2 value.

For such an ATAN2 value, the magnet 16 has a plurality of axial positions. From the ATAN2 value only, therefore, the axial position of the magnet 16 cannot be identified. However, in the range of a very short axial length of about 2 mm to 7 mm, for example, the axial position of the magnet 16 may be identified from the ATAN2 value. This range varies depends on the magnetic strength and size of the magnet and the distance between the sensor head and the magnet.

It is possible to expand a range in which the axial position of the magnet 16 can be identified, by using the magnetic-field direction-detecting sensor. The extension of the range will be described later with reference to FIG. 7 in which the Hall element 26 is provided as an example of the magnetic-field direction-detecting sensor. However, the magnetic-field direction-detecting sensor is not limited to the Hall element, and any type of sensor having a function of detecting a magnetic field direction may be provided as the magnetoresistive elements.

As shown in FIG. 2, the magnetoresistive bridge circuit 25 is mounted on the component mounting surface 23 of the printed circuit board 22, the Hall element 26, which is an example of the magnetic-field direction-detecting sensor, is mounted on the component mounting surface 24 opposite to the component mounting surface 23. The Hall element 26 is placed on a vertical line "U" passing through the center "O" of the magnetoresistive bridge circuit 25 and perpendicular to the component mounting surface 24. Therefore, the Hall element 26 is placed on the vertical line "U" and at a position shifted from the magnetoresistive bridge circuit 25 by the thickness of the printed circuit board 22, and the center of the Hall element 26 is aligned with the center "O" of the magnetoresistive bridge circuit 25 relative to the moving direction of the magnet 16. In other words, the Hall element 26 and the magnetoresistive bridge circuit 25 are respectively placed at positions different from each other in the circumferential direction of the cylinder 11, and respectively placed at position the same as each other in the moving direction of the piston rod 13.

Figure 5:
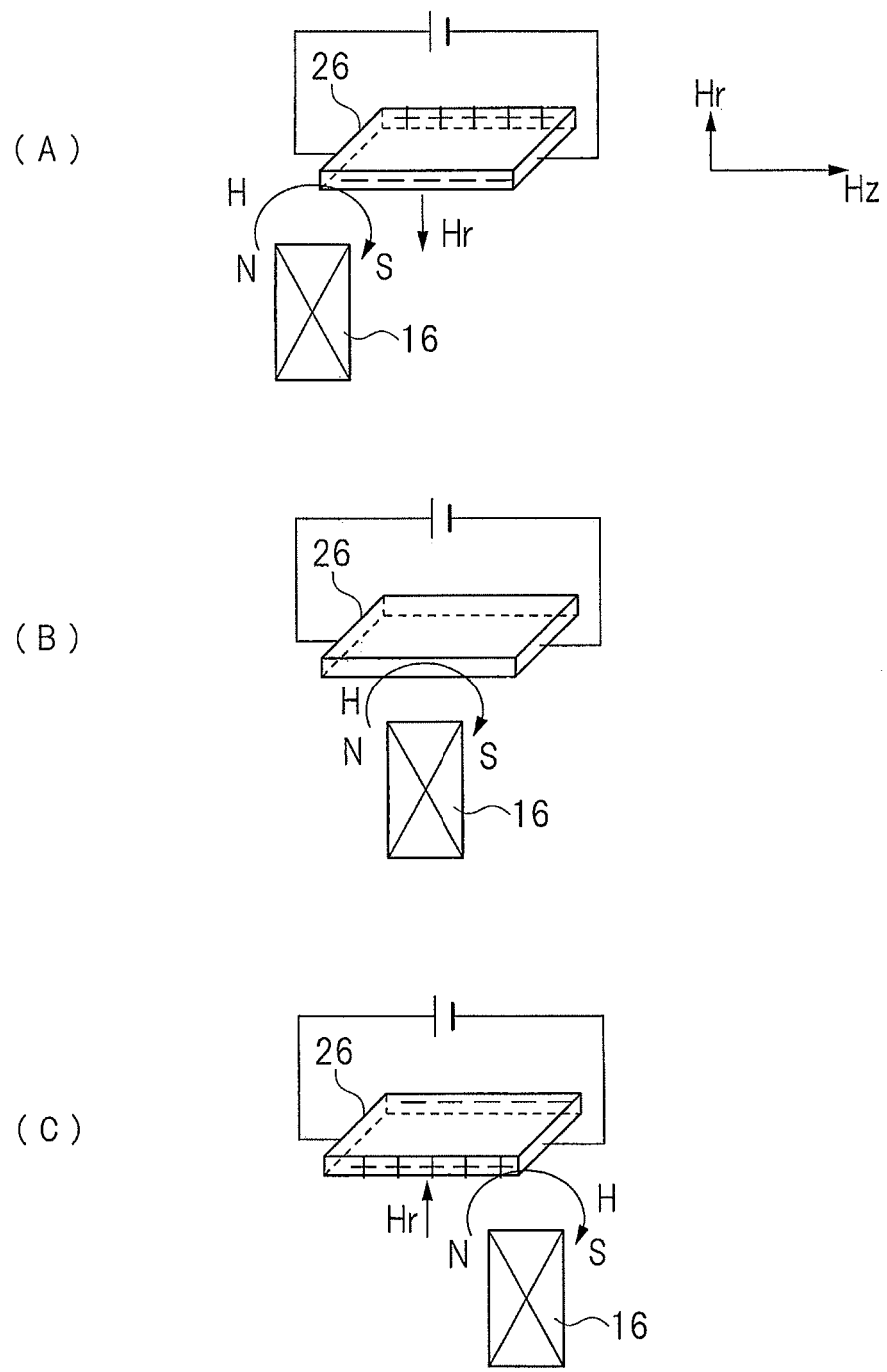
FIGS. 5(A) to 5(C) are schematic diagrams showing a magnetic field of a magnet and sensitivity directions of a Hall element.

FIG. 5 is schematic diagrams showing the polarities of Hall voltages, i.e., output voltages from the Hall element, the polarities varying depending on the positions of the magnet and Hall element.

When the magnet 16 moving in the axial direction approaches the Hall element 26, a magnetic-field "H" is applied to the Hall element 26. The magnetic-field "H" is divided into two components, that is, a magnetic-field strength (Hz) in a horizontal direction that is the moving direction of the magnet 16 and a magnetic-field strength (Hz) in a vertical direction perpendicular to the moving direction of the magnet 16. The Hall element 26 has a minimum sensitivity to a magnetic-field applied in the moving direction of the magnet 16, i.e., the first direction M1, and has a maximum sensitivity to a magnetic-field applied in a direction perpendicular to the moving direction of the magnet 16, i.e., the second direction M2. An output signal of the Hall element 26 is input to a comparator 28. An output signal of the comparator 28 selectively takes two voltage Values: High and Low. Based on such a voltage Value, whether the magnet 16 is located on one side or the other side in the axial direction with respect to the center "O" is determined.

A signal selectively taking two voltage Values corresponding to the polarities of output voltages of the Hall element 26 is defined as an area-identifying signal. When the output voltage of the Hall element 26 is input to the comparator 28, the area-identifying signal is output from the comparator 28, taking one of two values, i.e., High or Low. The comparator 28 is an example of an area-identifying means that generates the area-identifying signal from the output voltage of the Hall element. As the magnetic-field direction-detecting sensor, a magnetoresistive element different from the Hall element 26 may be used. The comparator 28 is applicable when it can generate the area-identifying signal, and may be provided as a combination of circuit elements or an IC. The area-identifying signal may be generated by a program.

As shown in FIG. 5(A), when the magnet 16 is on the left-hand side (on the same side as the head end) relative to the Hall element 26, the magnetic field "H" has a component acting in a direction from an upper surface to a lower surface of the Hall element 26. In this case, since the component Hr of the magnetic field "H" is in a negative direction, a voltage of an output terminal of the Hall element 26 has a negative polarity, and causes an output signal of the comparator 28, for example, to go High. As shown in FIG. 5(C), when the magnet 16 is on the right-hand side (on the same side as the rod end) relative to the Hall element 26, the magnetic field "H" has a component acting in a direction from the lower surface to the upper surface of the Hall element 26. In this case, since the component Hr of the magnetic field "H" is in a positive direction. As a result, contrary to that of FIG. 5(A), a voltage of the output terminal of the Hall element 26 has, for example, a positive polarity, and causes an output signal of the comparator 28, for example, to go Low. When the magnet 16 moves to reach the same position as the Hall element 26 in the axial direction, the polarity of the voltage of the output terminal of the Hall element 26 switches. Specifically, at the same position as a boundary position, the polarity of the voltage of the output terminal of the Hall element 26 is reversed and consequently the output signal of the comparator 28 is reversed as well. FIG. 5(B) shows a situation where the magnet 16 is at such a boundary position.

In this manner, on the basis of the polarity of the output terminal voltage from the Hall element 26, it is determined whether the magnet 16 is located in an area on one side or an area on the other side in the axial direction with respect to the center "O" of the magnetoresistive bridge circuit 25.

However, the minimum detection sensitivity of the Hall element 26 to the magnetic-field component Hr is, for example, about 15 Gauss, and therefore a magnetic field with intensity lower than 15 Gauss does not switch the output signal of the comparator 28. When the magnetic-field component Hr increases to about 15 Gauss or higher value, the polarity of the output terminal voltage of the Hall element 26 switches and the output signal of the comparator 28 switches as well. For this reason, a peak position "M" of the SIN signal generated by the magnetoresistive elements is different from the position at which the output signal of the comparator 28 switches, that is, a positive-side area switching point J1 and a negative-side area switching point J2.

Figure 6:
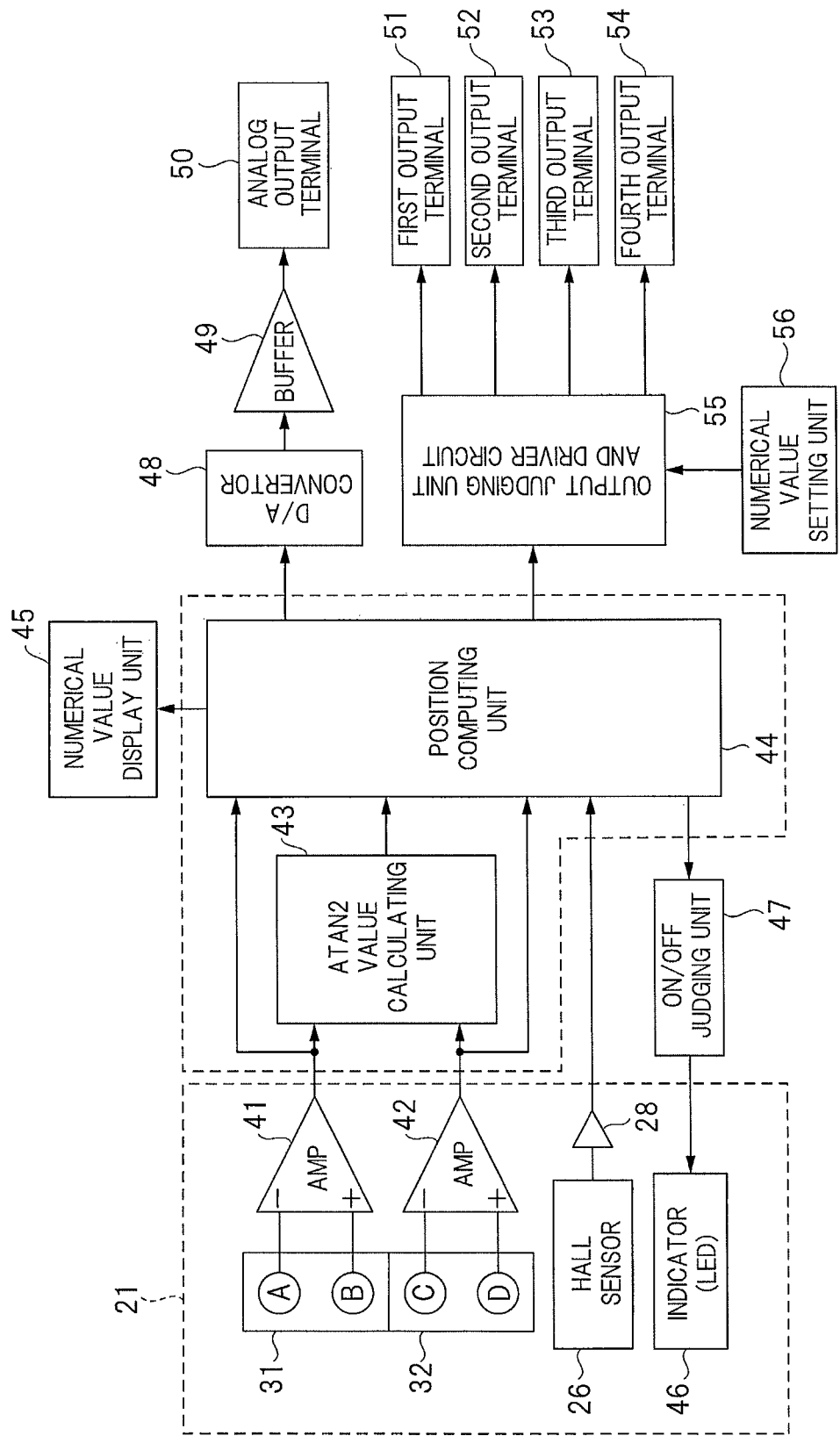
FIG. 6 is a block diagram of a position detecting apparatus.

FIG. 6 is a block diagram of a position detecting apparatus. The output voltages "A" and "B" of the first bridge circuit 31 are input to an amplifier 41, and the output voltages "C" and "D" of the second bridge circuit 32 are input to an amplifier 42. A first output signal output from the amplifier 41, which is a SIN signal, and a second output signal output from the amplifier 42, which is a COS signal, are sent to an ATAN2 value calculating unit 43. The ATAN2 value calculating unit 43, as an ATAN2 computing unit, is configured to compute an ATAN2 value on the basis of the SIN signal and the COS signal, and to output a value corresponding to the ATAN2 value, to a position-computing unit 44. In order to compute the ATAN2 value from the SIN signal and the COS signal, the ATAN2 value calculating unit 43 is provided as a unit independent of the position-computing unit 44 in the above manner. However, the ATAN2 value may be obtained through a program.

The ATAN2 value and an output signal of the comparator 28, which is an area-identifying signal, are sent to the position-computing unit 44.

The position of the magnet 16 in the axial direction thereof is computed by the position-computing unit 44, and is displayed in the form a numerical value on a numerical value display unit 45. An indicator 46 composed of LED is mounted on the printed circuit board 22 of the sensor head 21. The indicator 46 is turned on under control by an ON/OFF identifying unit 47, on the basis of a signal of the position-computing unit 44, and turns on when the piston 12 is located in a given range.

The position-computing unit 44 is configured to output an analog signal corresponding to the axial position of the magnet 16 to an analog output terminal 50, via a D/A converter 48 and a buffer 49. The position-computing unit 44 is configured to output positional signals to a first output terminal 51 to fourth output terminal 54, respectively, via an output identifying unit and driver circuit 55. A numerical value setting unit 56 is configured to input a preset value to the output identifying unit and driver circuit 55. By operating the numerical value setting unit 56, a detection position for switching on and off the first output terminal 51 to fourth output terminal 54, that is, the preset value is input. Once the detection position of the magnet 16 is set by the numerical value setting unit 56, the first to fourth output terminals 51 to 54 each output an on-signal to an external device when the magnet 16 reaches the set position. Up to four detection positions of the magnet 16 can be set by the numerical value setting unit 56. According to a signal of the analog output terminal 50, a number of positions can be detected by an external circuit.

Figure 7:
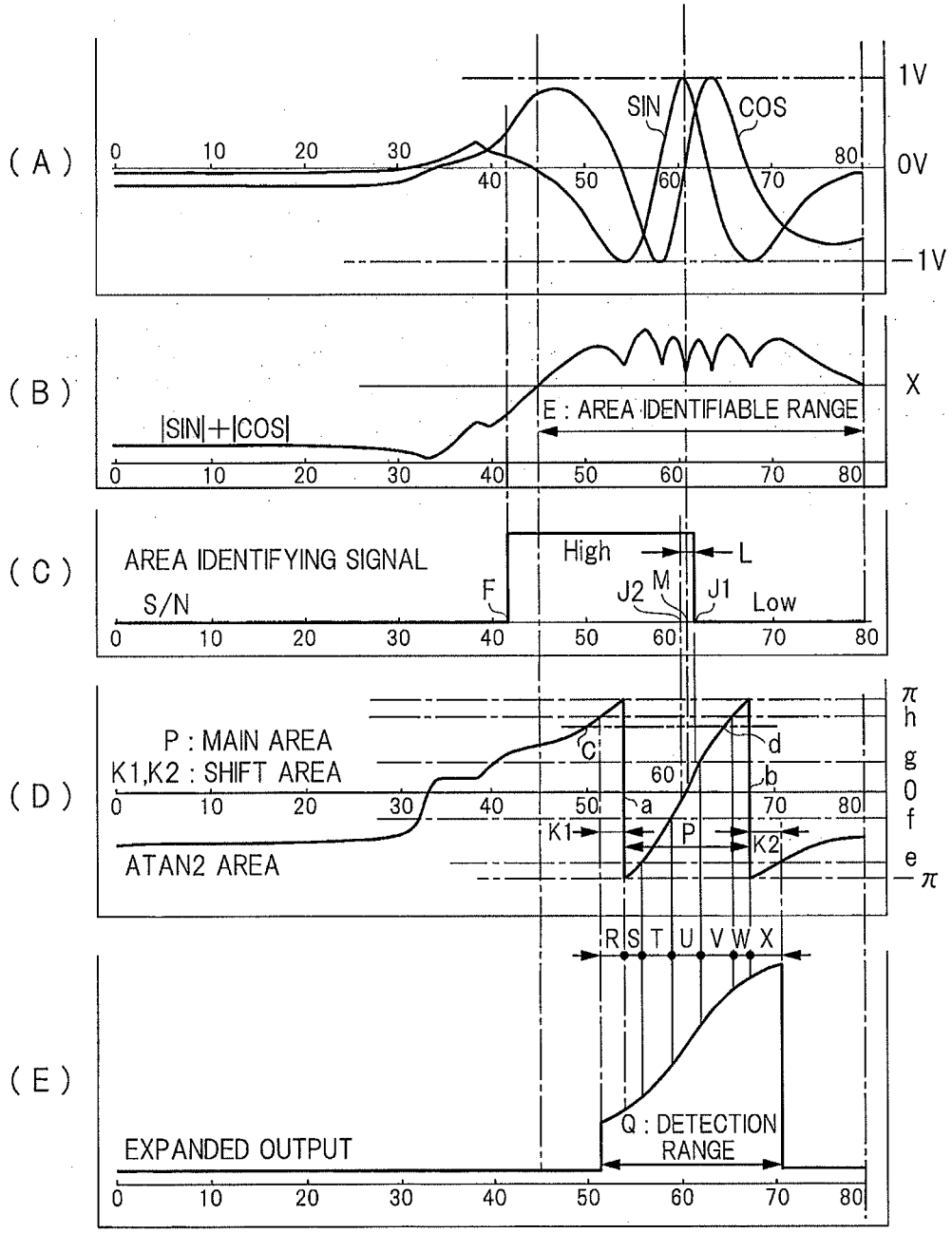
FIGS. 7(A) to 7(E) each is a graph of examples of computed values and internal signals of the position detecting apparatus, the computed values and internal signals corresponding to positions of the magnet, FIG. 7(A) showing a SIN signal and a COS signal that are output from a magnetoresistive bridge circuit, FIG. 7(B) showing the sum of the absolute value of the SIN signal and that of the COS signal, FIG. 7(C) showing an area-identifying signal based on an output voltage from the Hall element, FIG. 7(D) showing a ATAN2 value obtained on the basis of the SIN signal and the COS signal, and FIG. 7(E) showing an extended output signal obtained by adding a shift area value to a main area value.
Figure 8:
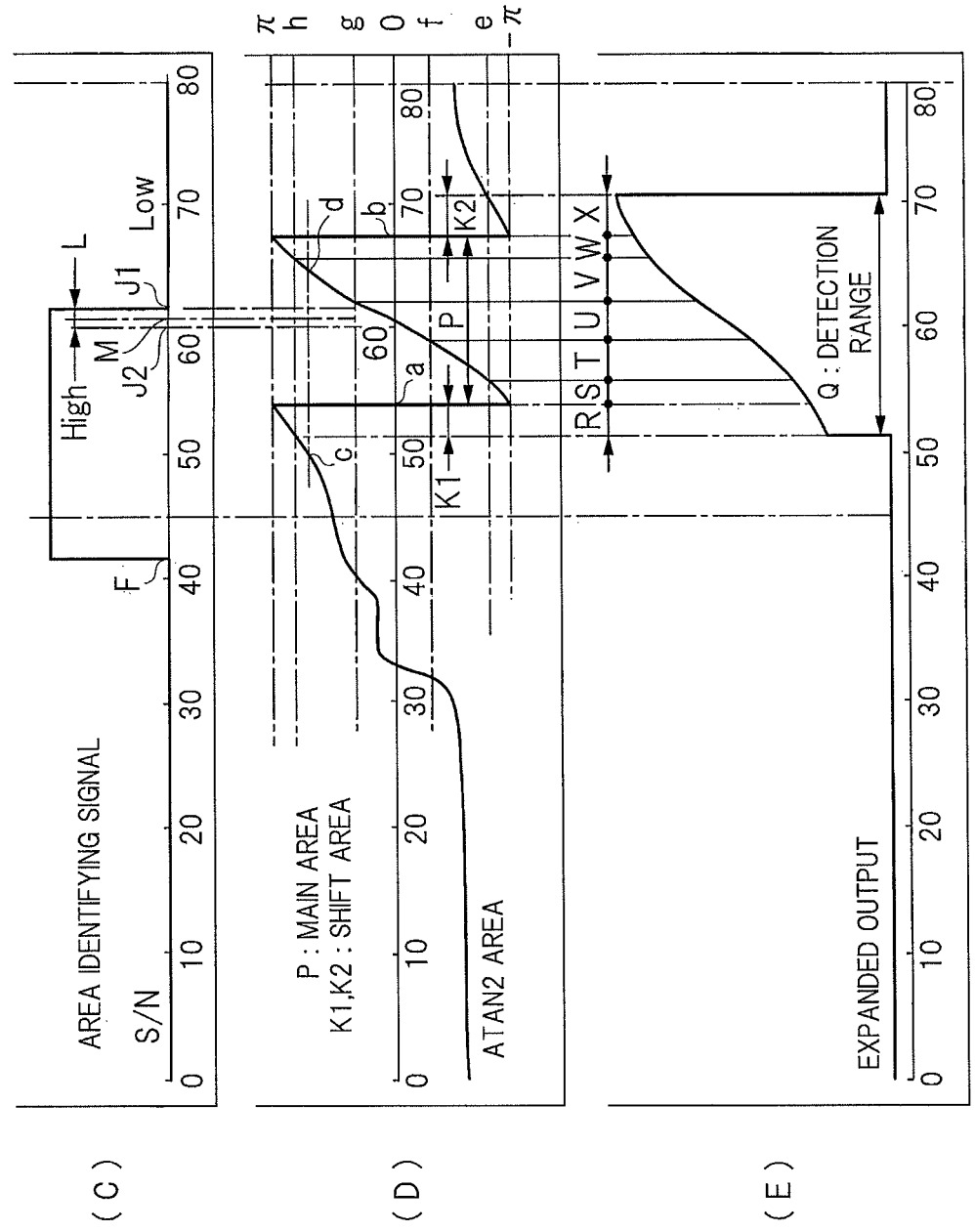
FIG. 8 is an enlarged view of a main part of FIG. 7.

FIG. 7 is a graph of an example of signals for calculating the position of the magnet 16, the signals being generated in the position detecting apparatus, and FIG. 8 is an enlarged view of a main part of FIG. 7.

FIG. 7 indicates that a SIN signal and a COS signal of the magnetoresistive bridge circuit 25, an area-identifying signal corresponding to the polarity of a Hall voltage of the Hall element 26, and a value computed from these signals change depending on the position of the piston 12 having the magnet

16. As described above, the first bridge circuit 31 is configured to output the SIN signal and the second bridge circuit 32 configured to output the COS signal different in phase from the SIN signal. The voltages of these output signals are offset to become zero when no magnetic field is present, and the output signals are amplified by the amplifiers 41 and 42 so that the voltage of each signal fluctuates between 1V and −1V at maximum.

FIG. 7(A) shows the SIN signal and the COS signal each amplified. When the magnet 16 is far away in the axial direction from the sensor head 21, a magnetic field applied to the first bridge circuit 31 and the second bridge circuit 32 is low in intensity. As a result, as observed in a section between 0 and 30 on the horizontal axis of FIG. 7(A), the rate of change of the SIN signal and the COS signal to a change in the position of the magnet 16 remains low. As observed in a section between 40 and 80 on the horizontal axis of FIG. 7(A), when the magnet 16 approaches the sensor head 21, the magnetic-field grows larger in intensity and a change in the direction of the magnetic-field to a change in the position of the magnet 16 is large. Thus, the resistance value of the magnetoresistive elements changes widely, which results in the large rate of change of the SIN signal and the COS signal.

FIG. 7(B) shows the sum of the absolute value of the SIN signal and that of the COS signal (|SIN|+|COS|). This sum is computed by the position-computing unit 44. FIG. 7(C) shows an area-identifying signal obtained from the Hall element 26.

When the magnet 16 approaches the sensor head 21, the sum shown in FIG. 7(B) increases, and a magnetic field with larger intensity that allows area determination is applied to the Hall element 26. In contrast, when the magnet 16 moves away from the sensor head 21 and the sum shown in FIG. 7(B) decreases as a consequence, a magnetic field applied to the Hall element 26 is small in intensity, in which case an output signal of the comparator 28 may not correspond to an output signal of the Hall element 26. It is therefore impossible to determine the position of the magnet using an area-identifying signal.

This happens in the following case. When the magnet 16 is away from the sensor head 21, an output signal of the comparator 28, i.e., an area-identifying signal just after power supply is started may not correspond, in some cases, to a point at which whether the magnet 16 is located on one side or the other side in the axial direction with respect to the center "O" is determined. In other words, the area-identifying signal just after power supply is started is uncertain. However, once the piston 12 has moved from one end to the other end, the output signal of the comparator 28 is latched. The area-identifying signal thus correspond to a point at which whether the magnet 16 is located in an area on one side or an area on the other side in the moving direction of the magnet 16 with respect to the center "O" is determined. In this manner, for the reason that the area-identifying signal is uncertain just after power supply is started, the area-identifying signal is adopted only in a specific range, which is an area identifiable range "E".

In this manner, the output signal of the comparator 28 is adopted only in the area in which the output signal of the comparator 28 corresponds to one side or the other side in the axial direction, i.e., the moving direction of the magnet 16 with respect to the center "O", that is, only in the area identifiable range "E" of FIG. 7(B). As a result, whether the magnet 16 is located on one side or the other side in the axial direction with respect to the center "O" can be determined base on the output signal of the comparator 28. An area identifiable threshold "X" for identifying the area identifiable range "E" from the sum of the absolute value of the SIN signal and that of the COS signal is determined to be a practically proper value so that a stable area-identifying signal can be selected.

If the area identifiable threshold "X" is determined to be a value too low, it is understood from FIGS. 7(B) and 7(C) that the area identifiable range "E" becomes wider than an area in which the area-identifying signal is effective. In such a case, an area in which the area-identifying signal is used includes part of an area on the left of a point F in FIG. 7(C), which is a non-usable area. This is a problem. To prevent such a problem from happening, the area identifiable threshold "X" is determined to be a practically proper value.

In an area on the right of the point F in FIG. 7(C), the polarity of the output voltage from the Hall element 26 is stable. By determining a value higher than the sum (|SIN|+|COS|) at the point F to be the area identifiable threshold "X", an area in which the polarity of the output voltage from the Hall element 26 is further stabilized can be used. In this manner, a High-signal value or Low-signal value corresponding to the polarity of the output voltage from the Hall element 26, that is, the area-identifying signal is adopted only in the area identifiable range "E" and is not adopted in ranges other than the area identifiable range "E". Not adopting the area-identifying signal means that the position-computing unit 44 does not compute the position of the magnet 16 and does not output a signal corresponding to the position of the magnet 16.

The area-identifying signal indicative of whether the magnet 16 is located in the area on one side or the area on the other side with respect to the center "O" of the magnetoresistive bridge circuit 25 switches at the positions of area switching points J1 and J2 shown in FIG. 7(C). When the magnet 16 moves from the left-hand side to the right-hand side in FIG. 7, the area-identifying signal switches at the area switching point J1. When the magnet 16 moves from the right-hand side to the left-hand side in FIG. 7, the area-identifying signal switches at the area switching point J2. In this manner, when the magnet 16 moves, the area-identifying signal switches after passing the point corresponding to the peak position of the SIN signal, which means that the area-identifying signal switches with a delay relative to the peak position of the SIN signal.

The Hall element 26 is at the same position as the center "O" of the magnetoresistive bridge circuit 25 in a view in the moving direction of the magnet 16. The area switching points J1 and J2, at which the polarity of the output signal of the Hall element 26 switches, however, are located slightly closer to the rod end and the head end, respectively, with respect to the position of the peak voltage Value of the SIN signal, as described above. This "positional difference", as described above, results due to the minimum detection sensitivity of the Hall element 26. Thus, a hysteresis of "L" in length with the peak voltage Value of the SIN signal at its center arises in the section between the area switching point J1 and the area switching point J2.

FIG. 7(D) shows an ATAN2 value obtained based on the SIN signal and the COS signal.

It has been described above that due to the minimum detection sensitivity of the Hall element 26, the peak position "M" of the SIN signal generated by the magnetoresistive elements is different in position from the area switching points J1 and J2 at which the output signal of the comparator 28 switches. For example, a value defined as a positive-side area-switching threshold "g" shown in FIG. 7(D) is slightly larger than an ATAN2 value corresponding to the area switching point J1. On the other hand, a value defined as a negative-side area-switching threshold "f" is substantially symmetrical with the positive-side area-switching threshold "g" with respect to the zero point on the ATAN2 value curve shown in FIG. 7(D). In another case, a value defined as the negative-side area switching threshold "f" shown in FIG. 7(D) may be slightly smaller than an ATAN2 value corresponding to the area switching point J2, and a value defined as the positive-side area switching threshold "g" may be substantially symmetrical with the negative-side area switching threshold "f" with respect to the zero point on the ATAN2 value curve shown in FIG. 7(D). In both cases, the positive-side area-switching threshold "g" and the negative-side area-switching threshold "f" have signs different from each other. The size relation between these thresholds is defined as $-\pi<f<0<g<+\pi$. The absolute value of the positive-side area-switching threshold "g" and that of the negative-side area-switching threshold "f" may be the same. The absolute values of both thresholds being different from each other, however, poses no problem, either. The area switching points J1 and J2 are included in an axial position area corresponding to an ATAN2 value range between the negative-side area-switching threshold "f" and the positive-side area-switching threshold "g".

In this manner, since the positive-side area-switching threshold "g" is determined from the negative-side area-switching threshold "f", it is possible to identify whether the magnet 16 is located on one side or the other side with respect to the center of the magnetoresistive bridge circuit 25, by using the area-identifying signal based on the output signal of the comparator 28 of the Hall element 26. On the other hand, in this process, the negative-side area-switching threshold "f" may be determined from the positive-side area-switching threshold "g".

The relationship between the area identifiable range "E", the negative-side area-switching threshold "f", and the positive-side area-switching threshold "g" will hereinafter be described, with focus put on the area-identifying signal. In the area identifiable range "E", which is obtained from the sum of the absolute value of the SIN signal and that of the COS signal, the area-identifying signal is adopted, except in a case where the ATAN2 value is in the range between the negative-side area-switching threshold "f" and the positive-side area-switching threshold "g". Outside the area identifiable range "E", the area-identifying signal is not adopted. Also in the case where the ATAN2 value is in the range between the negative-side area-switching threshold "f" and the positive-side area-switching threshold "g", the area-identifying signal is not adopted. The area-identifying signal is thus used in such a limited range. This avoids two problems: the problem that the output signal of the comparator 28 just after the start of power supply is uncertain and the problem that the peak position "M" of the SIN signal is different from the positions of the area switching points J1 and J2.

If a value smaller than the ATAN2 value corresponding to the area switching point J1 is defined as the positive-side area-switching threshold "g" shown in FIG. 7(D), the area switching point J1 is not included in the axial position area corresponding to the ATAN2 value range between the negative-side area-switching threshold "f" and the positive-side area-switching threshold "g". In other words, the output signal of the comparator 28 of the Hall element 26 switches at a position outside the axial position area corresponding to the ATAN2 value range between the negative-side area-switching threshold "f" and the positive-side area-switching threshold "g". In this case, therefore, the area-identifying signal cannot be used to determine whether the magnet 16 is located on one side or the other side with respect to the center of the magnetoresistive bridge circuit 25. For this reason, a value slightly larger than the ATAN2 value corresponding to the area switching point J1 is defined as the positive-side area-switching threshold "g" shown in FIG. 7(D).

It is preferable that the above length "L" resulting from the minimum detection sensitivity of the Hall element 26 be smaller and, ideally, be zero. However, the actual minimum detection sensitivity of the Hall element 26 does not achieve zero length "L" but produces a hysteresis with a certain size. To deal with this problem, the positive-side area-switching threshold "g" and the negative-side area-switching threshold "f" are determined in the above manner.

The ATAN2 value curve has a main area value and a shift area value. The main area value is a value in a main area "P" in which the magnet 16 is close to the center "O" of the magnetoresistive bridge circuit 25, and changes continuously in a form similar to a linear function. The shift area value is a value in shift areas K1 and K2 outside the main area "P". In the main area "P", the ATAN2 value takes a value changing continuously from $-\pi$ to $+\pi$. In this range between $-\pi$ to $+\pi$, the ATAN2 value changes substantially linearly in correspondence to the axial position of the magnet 16. When the magnet 16 moves from the shift area K1 to the main area "P", the ATAN2 value changes discontinuously from $+\pi$ to $-\pi$ at a turn point a. When the magnet 16 passes a turn point b to move from the main area "P" to the shift area K2, on the other hand, the ATAN2 value changes discontinuously from $+\pi$ to $-\pi$.

Based on the area identifiable range "E" determined with reference to the area identifiable threshold "X" in FIG. 7(B) and an area-identifying signal High and an area-identifying signal Low shown in the area identifiable range "E" in FIG. 7(C), the ATAN2 value is manipulated in such a manner as shown in FIG. 7(D) to obtain a final result shown in FIG. 7(E). This process is carried out as follows.

In the area identifiable range "E" of FIG. 7(B), when the ATAN2 value is between the negative-side area-switching threshold "f" and the positive-side area-switching threshold "g", the position of the magnet 16 can be determined using this fact only. The ATAN2 value in as-is state is thus output from the position-computing unit 44. This is because that when the ATAN2 value is between the negative-side area-switching threshold "f" and the positive-side area-switching threshold "g" in the area identifiable range "E", the position of the magnet 16 and the ATAN2 value corresponds to each other in one-to-one correspondence. This case corresponds to a section "U" of FIG. 7(E).

On the ATAN2 value curve, one value between the positive-side area-switching threshold "g" and $\pi$ is defined as a positive-side shift threshold "h". Likewise, on the ATAN2 value curve, one value between $-\pi$ and the negative-side area-switching threshold "f" is defined as a negative-side shift threshold "e". The size relation between these thresholds is defined as $-\pi<e<f<0<g<h<+\pi$. The absolute value of the positive-side shift threshold "h" and that of the negative-side shift threshold "e" may be the same. The absolute values of both thresholds being different from each other, however, poses no problem, either.

When the area-identifying signal shown in FIG. 7(C) is Low and the ATAN2 value is between the negative-side shift threshold "e" and the negative-side area-switching threshold "f", it is determined that the ATAN2 value is in a detection impossible area and therefore the ATAN2 value is not adopted. When the area-identifying signal is High and the ATAN2 value is between the negative-side shift threshold "e" and the negative-side area-switching threshold "f", it is determined that the ATAN2 value is in a detection possible area and therefore the ATAN2 value is adopted. The adopted ATAN2 value is output in as-is state, from the position-computing unit 44 because this is a case where the position of the magnet 16 and the ATAN2 value corresponds to each other in one-to-one correspondence. This case corresponds to a section "T" of FIG. 7(E). Furthermore, when the area-identifying signal is High and the ATAN2 value is between the negative-side shift threshold "e" and −π, it is determined that the ATAN2 value is in a detection possible area and therefore the ATAN2 value is adopted. The adopted ATAN2 value is output in as-is state, from the position-computing unit 44. This case corresponds to a section "S" of FIG. 7(E).

When the area-identifying signal shown in FIG. 7(C) is High and the ATAN2 value is between the positive-side area-switching threshold "g" and the positive-side shift threshold "h", it is determined that the ATAN2 value is in a detection impossible area and therefore the ATAN2 value is not adopted. When the area-identifying signal is Low and the ATAN2 value is between the positive-side area-switching threshold "g" and the positive-side shift threshold "h", it is determined that the ATAN2 value is in a detection possible area and therefore the ATAN2 value is adopted. The adopted ATAN2 value is output in as-is state, from the position-computing unit 44. This case corresponds to a section "V" of FIG. 7(E). Furthermore, when the area-identifying signal is Low and the ATAN2 value is equal to or higher than the positive-side shift threshold "h", it is determined that the ATAN2 value is in a detection possible area and therefore the ATAN2 value is adopted. The adopted ATAN2 value is output in as-is state, from the position-computing unit 44. This case corresponds to a section W of FIG. 7(E).

As described above, in the sections "S", "T", "U", "V", and "W", the position of the magnet 16 and the ATAN2 value corresponds to each other in one-to-one correspondence. ATAN2 values in the sections "S", "T", "U", "V", and "W", therefore, can be used as values (or signals) indicating positions of the magnet 16.

When the area-identifying signal shown in FIG. 7(C) is Low and the ATAN2 value is equal to or lower than the negative-side shift threshold "e", 2π is added to the ATAN2 value and the resulting value is output from the position-computing unit 44. This case corresponds to the range of the shift area K2 of FIG. 7(D) and to a section "X" of FIG. 7(E). This addition (ATAN2 value+2π) is equivalent to addition of the shift area K2 to the main area "P". Such an addition operation can be referred to as shift operation. When the area-identifying signal is Low and the ATAN2 value is equal to or lower than the negative-side shift threshold "e", the ATAN2 value and the position of the magnet 16 corresponds to each other in one-to-one correspondence. In this manner, by using the area-identifying signal based on the output signal of the Hall element 26, it is possible to add the shift area value in the shift area K2 to the main area value in the main area "P" to expand a detection range.

When the area-identifying signal shown in FIG. 7(C) is High and the ATAN2 value is equal to or higher than the positive-side shift threshold "h", 2π is subtracted from the ATAN2 value and the resulting value is output from the position-computing unit 44. This case corresponds to the range of the shift area K1 of FIG. 7(D) and to a section "R" of FIG. 7(E). This subtraction (ATAN2 value−2π) is equivalent to addition of the shift area K1 to the main area "P". Such a subtraction operation can be referred to as shift operation. When the area-identifying signal is High and the ATAN2 value is equal to or higher than the positive-side shift threshold "h", the ATAN2 value and the position of the magnet 16 corresponds to each other in one-to-one correspondence. In this manner, by using the area-identifying signal based on the output signal of the Hall element 26, it is possible to add the shift area value in the shift area K1 to the main area value in the main area "P" to extend the detection range.

In the above manner, in the area identifiable range "E" of FIG. 7(B), the ATAN2 value curve of FIG. 7(D) is divided into a plurality of sections by the thresholds "e", "f", "g", and "h", based on the area-identifying signal of FIG. 7(C). Particularly, by using the ATAN2 value ranges corresponding to the shift areas K1 and K2 of FIG. 7(D) as an extension of the ATAN2 value range in the main area "P", the ATAN2 value can be obtained as a continuous value. As a result, as shown in FIG. 7(E), the detection range is extended to a detection range "Q" from which an extended output value is obtained.

The conventional detection range, as mentioned above, is about 2 mm to 7 mm. According to the present invention, however, the detection range is extended to about 10 mm to 25 mm. This extended detection range varies depending on the magnetic strength and size of the magnet and the distance between the sensor head and the magnet.

By determining the positive-side shift threshold "h" so that it becomes lower than the positive-side shift threshold "h" shown in FIG. 7, the detection range "Q" can be increased so that the increased range becomes larger than the detection range "Q" shown in FIG. 7(E). Likewise, by determining the negative-side shift threshold "e" so that it becomes higher than the negative-side shift threshold "e" shown in FIG. 7, the detection range "Q" can be increased. As a result of this manipulation, however, the rate of change of the ATAN2 value to change in position of the magnet 16 is reduced in the extended shift areas K1 and K2, and this leads to a drop in resolution in these areas. For this reason, the positive-side shift threshold "h" and the negative-side shift threshold "e" are set on the basis of required specifications, as values which can reduce a positional detection error in the detection range "Q", that is, depending on allowable resolution.

Figure 9:
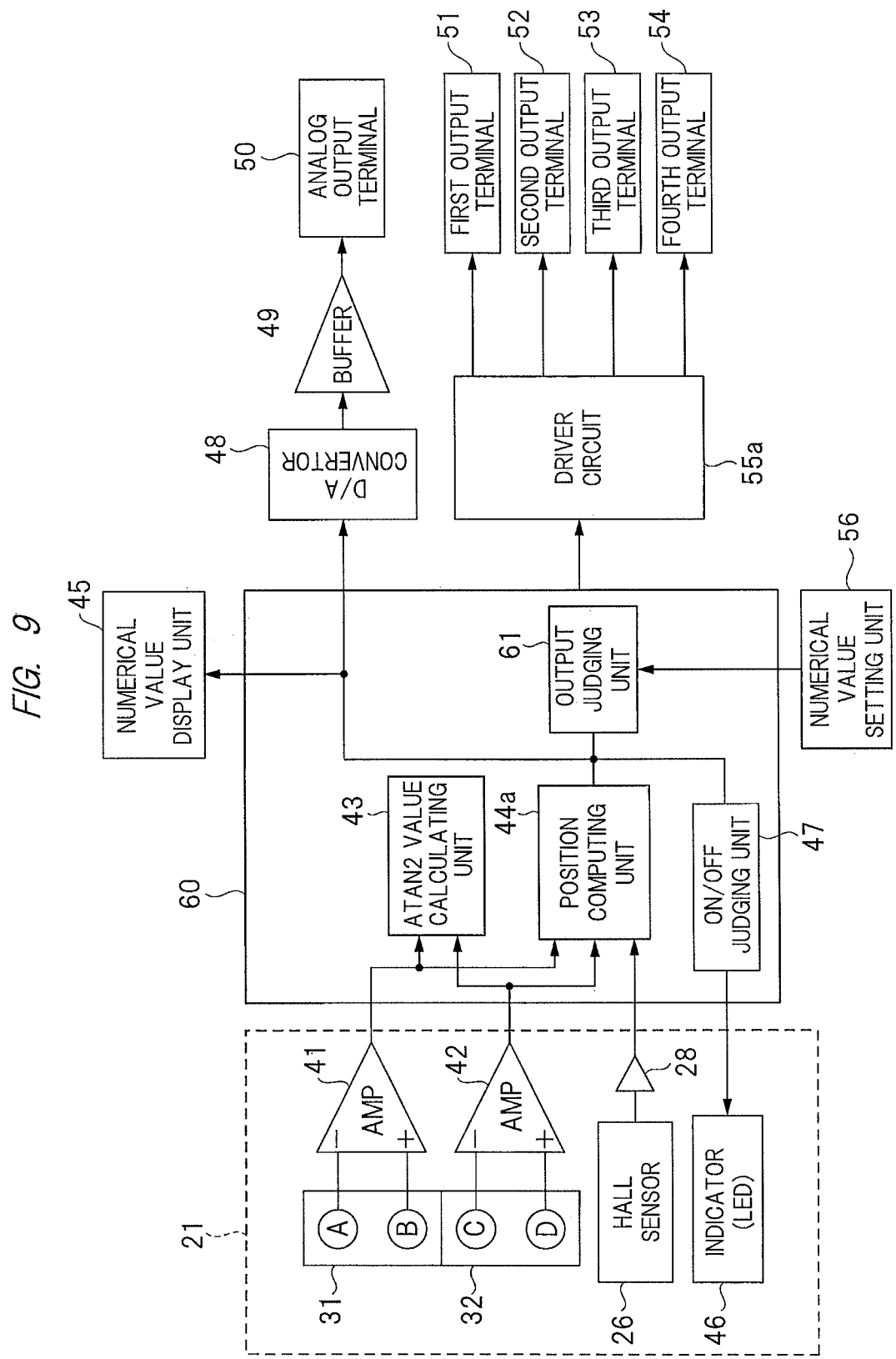
FIG. 9 is a block diagram of a modification of the position detecting apparatus.

FIG. 9 is a block diagram of a modification of the position detecting apparatus. In FIG. 6 shown above, the ATAN2 value calculating unit 43, the position-computing unit 44, the ON/OFF identifying unit 47, and the output identifying unit and driver circuit 55 are configured as separate units independent of each other. In contrast, in FIG. 9, the ATAN2 value calculating unit 43, a position-computing unit 44a, the ON/OFF identifying unit 47, and an output identifying unit 61 are configured by internal programs of an arithmetic processing unit 60 composed of CPU (Central Processing Unit). The output identifying unit 61 has a function equivalent to the remaining function of the output identifying unit and driver circuit 55 FIG. 6 that is left by removing the function of the driver circuit from the output identifying unit and driver circuit 55. FIG. 9 shows a functional configuration realized by the arithmetic processing unit 60. If the ATAN2 value calculating unit 43 is configured as an independent IC, it reduces a time for computing ATAN2 values, thereby reduces an overall processing time.

The embodiment described above is an example in which when the sum (|SIN|+|COS|) of the absolute value of the SIN signal and that of the COS signal exceeds the area identifiable threshold "X", the area-identifying signal shown in FIG. 7(C) is adopted. This sum (|SIN|+|COS|) may be replaced with the sum of the square of the SIN signal and the square of the COS signal. It is only necessary to compute a value that increases when the piston 12 having the magnet 16 approaches the sensor head 21 and that decreases when the piston 12 moves away from the sensor head 21, from the SIN signal and the COS signal. The sum (|SIN|+|COS|) of the absolute value of the SIN signal and that of the COS signal as well as the sum of the square of the SIN signal and that of the COS signal is merely an example of such a value.

Furthermore, it may possible that a proximity sensor configured to detect the approaching magnet, as well as the magnetoresistive bridge circuit 25 and the Hall element 26, is added to the sensor head 21, so that the area identifiable range "E" is determined based on a signal of the proximity sensor, instead of the sum (|SIN|+|COS|).

Figure 4:
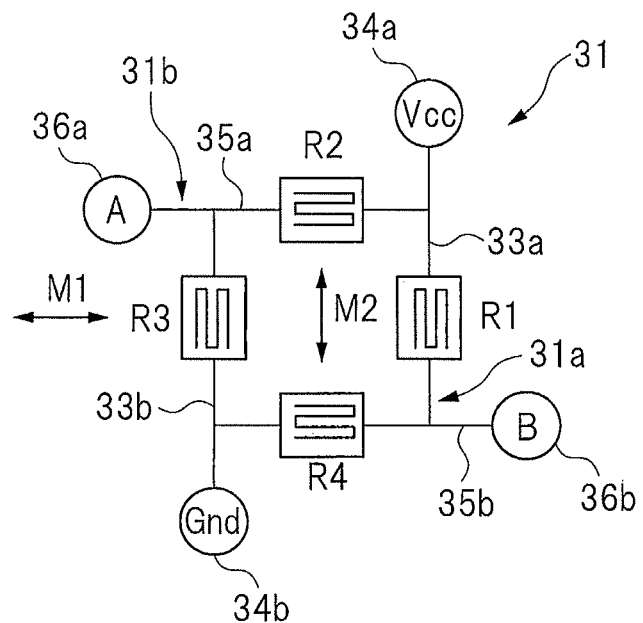
FIG. 4(A) is a circuit diagram showing a first bridge circuit formed by interconnecting wiring patterns selected from among those of the magnetoresistive elements shown in FIG. 3.
FIG. 4(B) is a circuit diagram showing a second bridge circuit formed by interconnecting the remaining wiring patterns selected from among those of the magnetoresistive elements shown in FIG. 3.
Figure 4:
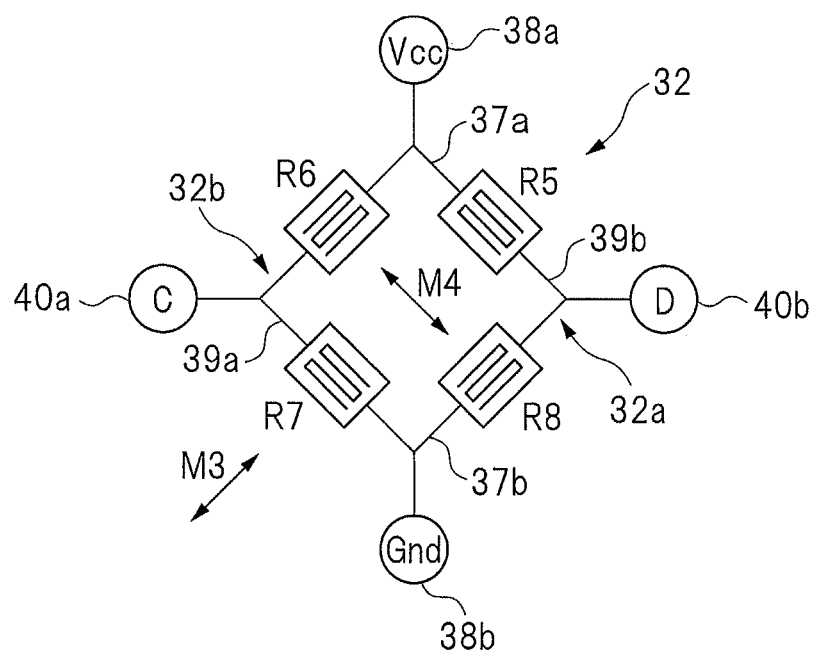
Figure 10:
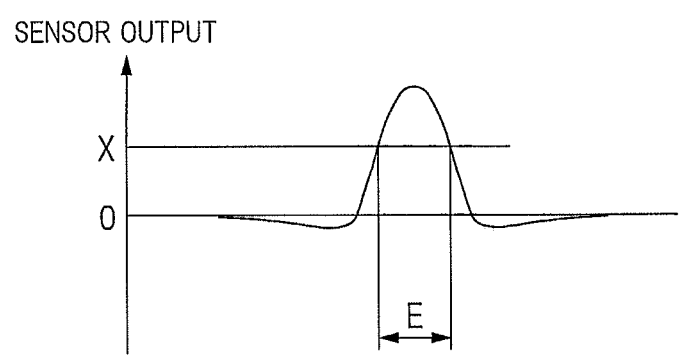
FIG. 10 is a characteristic curve diagram showing an output waveform from a proximity sensor for detecting an area identifiable range.

FIG. 10 is a characteristic curve diagram of an output waveform from the proximity sensor for detecting the area identifiable range "E". the proximity sensor has a circuit configuration including magnetoresistive elements, the circuit configuration being similar to the circuit configuration of the first bridge circuit 31 or second bridge circuit 32 shown in FIG. 4, is used. According to the proximity sensor having such a circuit configuration, as indicated in FIG. 10, the area identifiable range "E" can be obtained based on whether an output signal of the proximity sensor has exceeded the area identifiable threshold "X".

In this manner, what is essential is to detect and determine that the magnet 16 attached to the piston 12 approaches the sensor head 21, by obtaining a value computed from the SIN signal and the COS signal of the magnetoresistive bridge circuit 25 or using a signal of the proximity sensor, etc., attached to the sensor head 21 as a separate element to the magnetoresistive bridge circuit 25 and the Hall element 26.

As the magnetic-field direction-detecting sensor, a magnetic sensor 26a may be used in place of the Hall element 26 on the condition that the magnetic sensor 26a outputs an output signal corresponding to the direction of a magnetic-field and is placed such that the maximum sensitivity of the magnetic sensor 26a is directed along the second direction.

Figure 11:
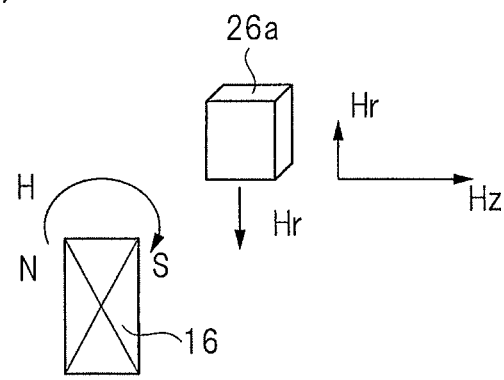
FIGS. 11(A) to 11(E) are schematic diagrams showing a magnetic field of the magnet and sensitivity directions of a magnetic sensor.
Figure 11:
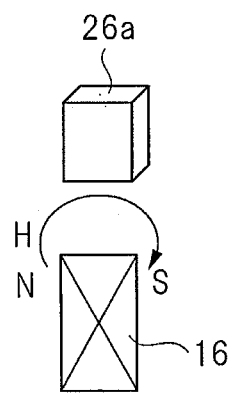
Figure 11:
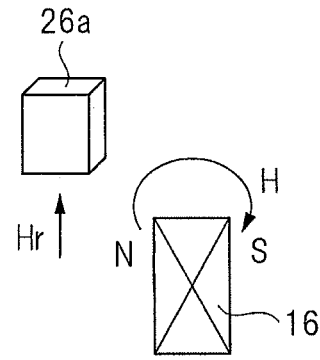
Figure 11:
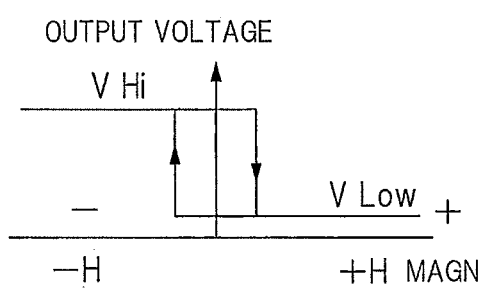
Figure 11:
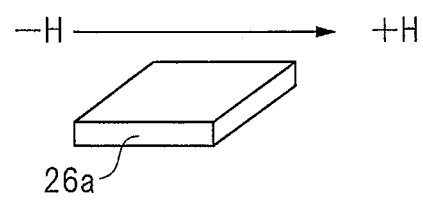
Figure 12:
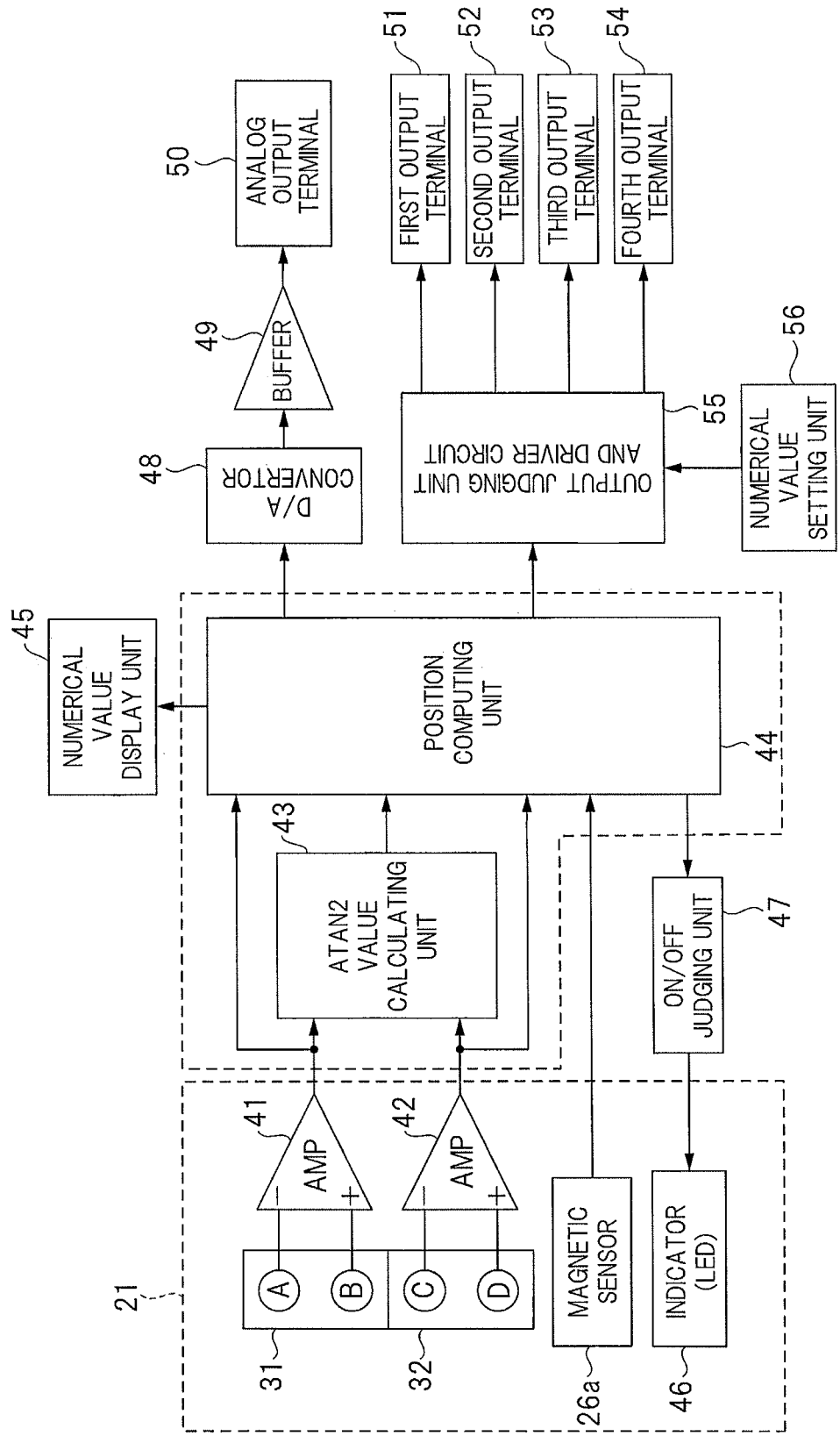
FIG. 12 is a block diagram of a position detecting apparatus having the magnetic sensor shown in FIG. 11.

FIG. 11(A) to 11(E) are schematic diagrams showing sensitivity directions of the magnetic sensor 26a relative to the magnetic field of the magnet, and FIG. 12 is a block diagram of a position detecting apparatus having the magnetic sensor 26a shown in FIG. 11. As shown in FIG. 11(A), when the magnet 16 is on the left-hand side relative to the magnetic sensor 26a, the magnetic field "H" has a component acting in a direction from the upper surface to lower surface of the magnetic sensor 26a. In this case, therefore, the component Hr of the magnetic field "H" acts in a negative direction. As a result, an output voltage "V" from the magnetic sensor 26a goes High, as shown in FIG. 11(D). As shown in FIG. 11(C), when the magnet 16 is on the right-hand side relative to the magnetic sensor 26a, the magnetic field "H" has a component acting in a direction from the lower surface to upper surface of the magnetic sensor 26a. In this case, therefore, the component Hr of the magnetic field acts in a positive direction. As a result, the output voltage "V" from the Hall element 26 goes Low. When the magnet 16 moves from the left-hand side to the right-hand side relative to the magnetic sensor 26a or moves from the right-hand side to the left-hand side, the output voltage "V" from the magnetic sensor 26a changes with a hysteresis. Changing the direction of attachment of the magnetic sensor 26a by 180 degrees results in switching from a High output voltage "V" from a Low output voltage "V" or vice versa. Reversing the direction of attachment of the magnet 16 also results in switching from a High output voltage "V" from a Low output voltage "V" or vice versa. Such switching between a high-voltage signal and a low-voltage signal can be dealt with an internal program.

In this manner, the magnetic sensor 26a has: a magnetic-field direction-detecting sensor configured to detect the direction of a magnetic-field; and a comparator. The magnetic sensor 26a has a function of outputting an area-identifying signal for identifying whether the magnet 16 is on one side of the area on one side or the area on the other side in the axial direction with respect to the center "O" of the magnetoresistive bridge circuit 25, and is therefore capable of area determination based on the output voltage from the magnetic sensor 26a.

FIG. 1 shows the cylinder 11 provided with the position detecting apparatus. This position detecting apparatus may be applied to not only the cylinder 11 but also an actuator for opening and closing chuck/chucks that grip a workpiece, etc.

Figure 13:
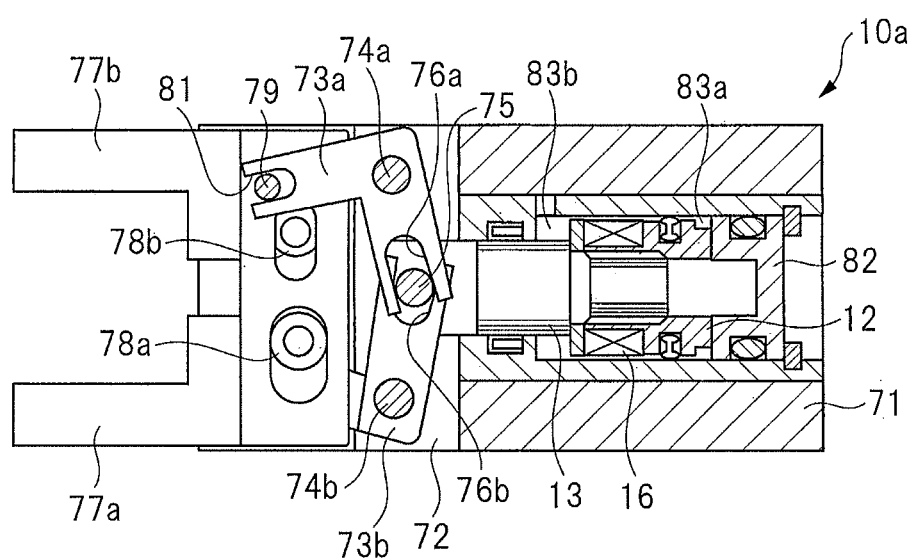
FIG. 13 is a sectional diagram of a modification of the actuator provided with the position detecting apparatus.

FIG. 13 is a sectional diagram of a modification of the actuator provided with the position detecting apparatus. This actuator is an air chuck 10a configured to grip a workpiece. The air chuck 10a includes an actuator body 71 made of non-magnetic material. The piston 12, as a reciprocating member, is fitted to the actuator body 71 such that the piston 12 reciprocably moves in the axial direction. The piston 12 is attached to the piston rod 13. One end of the piston rod 13 projects into a slit 72 formed on one end of the actuator body 71, where two L-shaped driving levers 73a and 73b are supported by supporting point pins 74a and 74b such that the driving levers 73a and 73b are free to turn in the slit 72.

A rod pin 75 is fitted to the front end of the piston rod 13, and is slidably engaged with engaging slots 76a and 76b formed respectively on the base ends of the driving levers. Two slidable levers 77a and 77b functioning as fingers for gripping a workpiece, etc., are provided on the front end of the actuator body 71. The slidable levers 77a and 77b slide freely in a direction perpendicular to the moving direction of the piston rod 13, respectively, via guide rings 78a and 78b fitted to the actuator body 71. A slide pin 79 is fitted to the slidable lever 77a. The slide pin 79 is provided on the slidable lever 77a and is slidably engaged with an engaging slot 81 formed on the front end of the driving lever 73a, and is therefore driven by the swinging motion of the driving lever 73a. In the same manner, another slide pin (not shown) is fitted to the slidable lever 77b, is engaged slidably with an engaging slot (not shown) formed on the front end of the driving lever 73b, and is therefore driven by the swinging motion of the driving lever 73b.

When fluid is supplied into a pressure chamber 83a for piston projection, defined by a cover 82 fitted on the actuator body 71 and the piston 12, the piston rod 13 is driven to project. As a result, two slidable levers 77a and 77b are driven via the driving levers 73a and 73b to a position at which the slidable levers 77a and 77b are separated apart from each other across a maximum distance. When the fluid is supplied into a pressure chamber 83b for piston retreat, in contrast, the piston rod 13 is retreated to a position shown in FIG. 13. As a result, the slidable levers 77a and 77b are driven via the driving levers 73a and 73b to a position at which the slidable levers 77a and 77b are closet to each other.

In this manner, via a gripping operation to be performed by bringing the slidable levers 77a and 77b closer to each other, the workpiece, etc., is gripped and held by the air chuck 10a. On the other hand, via a releasing operation to be performed by moving the slidable levers 77a and 77b away from each other, the workpiece, etc., is released from the air chuck 10a. On the basis of the position of the magnet 16 attached to the piston 12, the grip position of the slidable levers 77a and 77b is detected. In order to detect the position of the magnet 16, the sensor head 21 shown in FIG. 1 is attached to the actuator body 71.

In this manner, the above position detecting apparatus can be applied also to air chuck 10a configured to drive chucks for holding a workpiece, etc., to open/close the chucks via a reciprocating member.

In each actuator, the position of the magnet 16 corresponds to that of the reciprocating member, such as the piston 12. Depending on the type of the actuator, a selection can be made between a method of detecting the position of the reciprocating member on the basis of the main area value only and a method of detecting the position of the reciprocating member on the basis of an output signal of the detection range "Q" extended by adding the shift area value to the main area value.

In the magnetoresistive bridge circuit 25 shown in FIGS. 3 and 4, each of the first bridge circuit 31 and the second bridge circuit 32 is provided as a full-bridge circuit. However, each of these circuits may be provided as a half-bridge circuit.

The present invention is not limited to embodiments described above, and may be modified into various forms of applications without departing from the scope of the present invention. For example, while FIGS. 1 and 2 each shows an actuator 10 that linearly reciprocates the piston rod by air pressure, the present invention can be applied to an actuator that linearly reciprocates the piston rod by not air pressure but by hydraulic pressure created by fluid, etc.

The position detecting apparatus according to the present invention is used to detect the position of a reciprocating member, such as a piston rod, that is driven by an actuator, such as a hydraulic cylinder.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A position detecting apparatus configured to detect a position of a magnet that moves in a direction of magnetization, the position detecting apparatus comprising:
    a first bridge circuit including: a magnetoresistive element having a maximum sensitivity to a magnetic field in a first direction the same as the direction of magnetization; and a magnetoresistive element having a maximum sensitivity to a magnetic field in a second direction perpendicular to the first direction, the first bridge circuit outputting a SIN signal;
    a second bridge circuit including: a magnetoresistive element having a maximum sensitivity to a third direction tilted against the first direction by 45 degrees; and a magnetoresistive element having a maximum sensitivity to a fourth direction perpendicular to the third direction, the second bridge circuit outputting a COS signal;
    area-identifying means having a magnetic-field direction-detecting sensor, and configured to output an area-identifying signal for identifying whether the magnet is in an area defined on one side from a center of the first bridge circuit and the second bridge circuit in a moving direction of the magnet, or in an area defined on the other side from the center of the first bridge circuit and the second bridge circuit in the moving direction of the magnet;
    an ATAN2 value-computing unit configured to compute an ATAN2 value on the basis of the SIN signal and the COS signal; and
    a position-computing unit configured to compute a position of the magnet on the basis of the area-identifying signal and the ATAN2 value.

2. The position detecting apparatus according to claim 1, wherein
    a direction of a maximum sensitivity of the magnetic-field direction-detecting sensor is aligned along the second direction,
    the magnetic-field direction-detecting sensor is configured to output an output signal depending on a direction of a magnetic-field.

3. The position detecting apparatus according to claim 1, wherein
    the area-identifying means is configured to receive an output voltage of the magnetic-field direction-detecting sensor, and to output an area-identifying signal corresponding to a polarity of the magnet, the area-identifying signal being either High or Low.

4. The position detecting apparatus according to claim 1, wherein
    the center of the first bridge circuit and the second bridge circuit is the same in position as the magnetic-field direction-detecting sensor in the moving direction of the magnet.

5. The position detecting apparatus according to claim 4, comprising a printed circuit board in which component mounting surfaces are respectively provided on front and back surfaces thereof, wherein
    the magnetoresistive element is mounted on one of the component mounting surfaces of the printed circuit board,
    the magnetic-field direction-detecting sensor is mounted on the other of the component mounting surfaces of the printed circuit board.

6. The position detecting apparatus according to claim 1, wherein
    when a value computed from the SIN signal and the COS signal exceeds an area-identifying threshold for identifying the position of the magnet, the position-computing unit is configured to compute the position of the magnet.

7. The position detecting apparatus according to claim 1, comprising a proximity sensor configured to detect the magnet approaching the center, wherein
    when the proximity sensor detects the magnet approaching the center, the position-computing unit is configured to compute the position of the magnet.

8. The position detecting apparatus according to claim 1, wherein
    a position at which the area-identifying signal is switched and which is behind a peak position of the SIN signal, is defined as an area switching point,
    a value whose absolute value is larger than an absolute value of the ATAN2 value corresponding to the area switching point is defined as an area-switching threshold,
    when an absolute value of the ATAN2 value is larger than the area-switching threshold, the position-computing unit is configured to identify an area of the magnet on the basis of the area-identifying signal, and compute the position of the magnet, and
    when the absolute value of the ATAN2 value is smaller than the area-switching threshold, the position-computing unit is configured to compute the position of the magnet without using the area-identifying signal.

9. The position detecting apparatus according to claim 1, wherein the first bridge circuit is a full-bridge circuit including:
a first circuit pattern including a first magnetoresistive element having a maximum sensitivity to a magnetic-field in the first direction and a second magnetoresistive element having a maximum sensitivity to a magnetic-field in the second direction; and
a second circuit pattern including a third magnetoresistive element having a maximum sensitivity to a magnetic-field in the first direction and a fourth magnetoresistive element having a maximum sensitivity to a magnetic-field in the second direction,
the second bridge circuit is a full-bridge circuit including:
a third circuit pattern including a fifth magnetoresistive element having a maximum sensitivity to a magnetic field in the third direction and a sixth magnetoresistive element having a maximum sensitivity to a magnetic field in the fourth direction; and
a fourth circuit pattern including a seventh magnetoresistive element having a maximum sensitivity to a magnetic field in the third direction and an eighth magnetoresistive element having a maximum sensitivity to a magnetic field in the fourth direction.

10. The position detecting apparatus according to claim 1, wherein
the position of the magnet is computed using a main area value of the ATAN2 value.

11. The position detecting apparatus according to claim 1, wherein
an extended output value is computed by shifting and adding a shift area value between a shift threshold in a shift area of the ATAN2 value and a turn point of the ATAN2 value to a main area value of the ATAN2 value.

12. The position detecting apparatus according to claim 1, wherein
the magnetic-field direction-detecting sensor is a Hall element.

13. An actuator configured to drive a reciprocating member by hydraulic pressure, the actuator comprising:
a magnet attached to the reciprocating member; and
the position detecting apparatus according to claim 1.

14. The position detecting apparatus according to claim 8, wherein
the area-switching threshold includes a negative-side area-switching threshold and a positive-side area-switching threshold,
the shift threshold includes a negative-side shift threshold and a positive-side shift threshold, and
the positive-side shift threshold is larger than the positive-side area-switching threshold, and the negative-side shift threshold is smaller than the negative-side area-switching threshold.

* * * * *